United States Patent [19]

Guyen-Phuoc

[11] 3,962,565

[45] June 8, 1976

[54] APPARATUS FOR PRESETTING A COUNTER TO A GIVEN INITIAL COUNT

[75] Inventor: Bao-Dam N. Guyen-Phuoc, Orsay, France

[73] Assignee: Schlumberger Instruments et Systemes, Paris, France

[22] Filed: May 6, 1974

[21] Appl. No.: 467,027

[30] Foreign Application Priority Data
May 8, 1973 France.................... 73.16453

[52] U.S. Cl..................... 235/92 PE; 235/92 CC; 235/92 EA; 235/92 CA; 235/92 R; 328/48
[51] Int. Cl.².................... H03K 21/18; H03K 21/36
[58] Field of Search....... 235/92 PE, 92 CC, 92 EA, 235/92 DE, 92 CA; 328/48

[56] References Cited
UNITED STATES PATENTS

| | | | |
|---|---|---|---|
| 3,064,889 | 11/1962 | Hupp.............................. | 235/92 EA |
| 3,272,970 | 9/1966 | Laycak et al................... | 235/92 PD |
| 3,413,452 | 11/1968 | Schlein............................ | 235/92 PE |
| 3,420,989 | 1/1969 | Sapp................................ | 235/92 CA |

*Primary Examiner*—Gareth D. Shaw
*Assistant Examiner*—John P. Vandenburg
*Attorney, Agent, or Firm*—William R. Sherman; Stewart F. Moore; Kevin McMahon

[57] ABSTRACT

Apparatus for presetting an electric pulse counter to a given count without any action on its parallel input terminals and/or its parallel output terminals. The apparatus comprises a pulse generator which is connected, during a preset operation, to the count input of the counter through an electronic gate. The electronic gate is controlled by an auxiliary circuit. In one embodiment, the auxiliary circuit comprises as many voltage comparators as flip-flops in the counter. The voltage comparators enable the electronic gate as long as the states of the flip-flops are different from the desired states. In another embodiment, the auxiliary circuit mainly comprises a divider by N, N being the desired count. In a first step, the divider is reset and the counter is caused to count up to its maximum count and to deliver an overflow pulse when it resets. In a second step starting with the overflow pulse, both counter and divider count up from zero and the electronic gate is closed when the divider reaches the N-count. Lastly, in a third embodiment, the output of the electronic gate is also connected to a down-counter. The counting is stopped when the counter resets and delivers an overflow pulse. Then, at that time, the counter is reset while the down-counter displays the count which was in the counter at the beginning of the preset operation. The down-counter may be connected to a display unit.

8 Claims, 4 Drawing Figures

APPARATUS FOR PRESETTING A COUNTER TO A GIVEN INITIAL COUNT

BACKGROUND OF THE INVENTION

1. Field of the Invention

This invention relates generally to techniques for the presetting of pulse counters and more particularly to an apparatus performing the automatic presetting of a counter to a predetermined initial count without any action on the respective control input terminals of its flip-flops. The invention also relates to an apparatus performing the presetting of a counter to a predetermined initial count, not only without any action on the control input terminals of its flip-flops, but also without the use of its parallel output terminals. At last, the invention relates to an apparatus permitting the display of the state of a counter without using its parallel output terminals.

The apparatus according to the present invention may be used not only for the resetting of counters operating at high frequencies, but also for the presetting of predetermination counters used at very high frequencies as variable-delay circuits.

2. Description of the Prior Art

Usually when it is desired to preset a counter to a given initial count, a pulse is applied to each of the flip-flops of this counter, on its set input (S input) or on its reset input (R input) depending on the desired state. Thus, for example, to preset to nine a 4-digit binary counter, a pulse is applied to the S, R, R and S inputs of the flip-flops having the weights $2^0$, $2^1$, $2^2$ and $2^3$ respectively and the flip-flops switch to the states 1, 0, 0, and 1, respectively, which correspond to the binary count nine. Naturally, in the most frequent case where it is required to reset the counter, the pulse is applied to each of the R input of the four flip-flops.

The above-described technique, while suitable at low frequencies, does not work satisfactorily at high frequencies, for example over 100 MHz. This drawback is due to the fact that the input terminals on which the pulses are applied have stray capacitances which lower the cutoff frequency of the counter and thus significantly lower its ability to work satisfactorily at high frequencies.

SUMMARY OF THE INVENTION

It is an object of the present invention to provide an apparatus which automatically presets an electric pulse counter to a predetermined initial count without any action on its input terminals.

A first type of apparatus made in accordance with the present invention comprises first means for comparing the count of a counter to be preset with the initial count to which it is to be preset, said first means delivering an inhibition signal when the counter is in said initial count, and second means responsive to said inhibition signal for applying pulses to the count input terminal of the counter when said inhibition signal is not present.

Thus, as long as the counter displays a count different from the initial count to which it is to be preset, pulses are applied to its count input. When the counter reaches the desired count, the pulses are prevented from being applied to the count input terminal and consequently the counter stays at the preset count. It will be apparent that the presetting of the counter to an initial count is accomplished without any action on the S and R inputs of its flip-flops. This mode of operation avoids connections on these control input terminals, which eliminates the stray capacitances and as a result the counter may operate at a higher frequency (of several hundred MHz) than the frequency at which it could operate if the input terminals were used.

A second type of apparatus made in accordance with the present invention comprises first means, triggered by a preset signal, for applying pulses to the count input of a counter to be preset to a predetermined initial count, and second means, triggered by the overflow pulse appearing at the output of the counter so as to cause the application to the count input of the counter of a number of pulses equal to said predetermined initial count.

Thus, with this second type of apparatus, the presetting of a counter to an initial count N starts with the application of pulses which cause the counter to count up to its maximum count, then to reset and deliver an overflow pulse on its output. This overflow pulse triggers the feeding to the counter of a train of N pulses which cause the counter to be set at the desired initial count N. By this mode of operation, the counter is preset to a predetermined initial count, not only without any action on the control inputs of its flip-flops, but also without the use of its parallel outputs.

This second apparatus is substantially more advantageous than the first one when operating at very high frequencies. The first type of apparatus is in fact connected to the parallel outputs of the counter and it can be easily understood that these connections cause a decreasing of the cutoff frequency due to stray capacitances. On the contrary, the second type of apparatus is connected only between the count input and the output of the counter, which reduces the stray capacitances to a minimum and consequently the counter can work satisfactorily at very high frequencies (of the order of GHz).

It would not be proper to display the state of a counter associated to an apparatus of the second type by using its parallel outputs because this would reintroduce stray capacitances which this apparatus is precisely intended to eliminate. Then, it is a further object of the invention to provide an apparatus permitting to display the state of a counter wihtout using its parallel outputs.

In accordance with the present invention, such an apparatus comprises means for applying pulses to the count input of the counter, said means being triggered by a display signal and inhibited by an overflow pulse appearing at the output of the counter when it resets, and a down-counter, reset by said display signal, which receive the pulses applied to the counter.

Thus, with a counter having a capacity K filled up to count L, the display signal triggers the application, to the count input, of a train of K-L pulses which reset the counter. These K-L pulses are also applied to the count input of the down-counter which, initially at zero, is thus placed in the count L. A readout system is associated with the down-counter so as to display the count L.

The foregoings show that the present invention allows, after a count phase, the display of the count and the presetting to a given initial count of a "blind" counter, i.e. a counter having only one input and one output. Such a counter can thus work at very high frequencies since the stray capacitances which lower the cutoff frequency have been reduced to a minimum.

BRIEF DESCRIPTION OF THE DRAWINGS

Other objects and advantages of the present invention will be apparent from the following description of one embodiment of each of these apparatuses taken in reference with the accompanying drawings in which.

DESCRIPTION OF PREFERRED EMBODIMENTS

Figure 1:
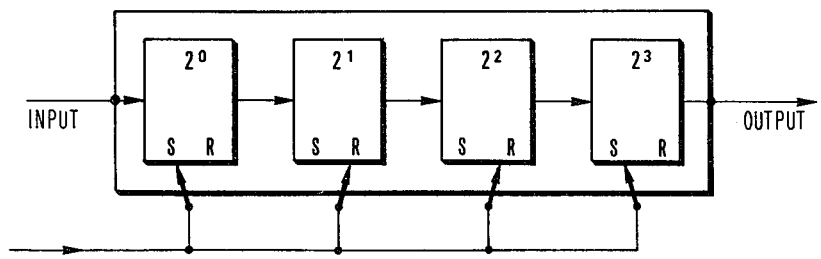
FIG. 1 illustrates the prior art manner of presetting to 9 a 4-digit binary counter.

FIG. 1 illustrates an electric pulse counter comprised of four flip-flops connected in series and having a count input, an output as well as eight control inputs connected to the S and R inputs. As explained in the Description of the prior art, the counter is preset to count 9 by activating the S, R, R and S control inputs respectively.

Figure 2:
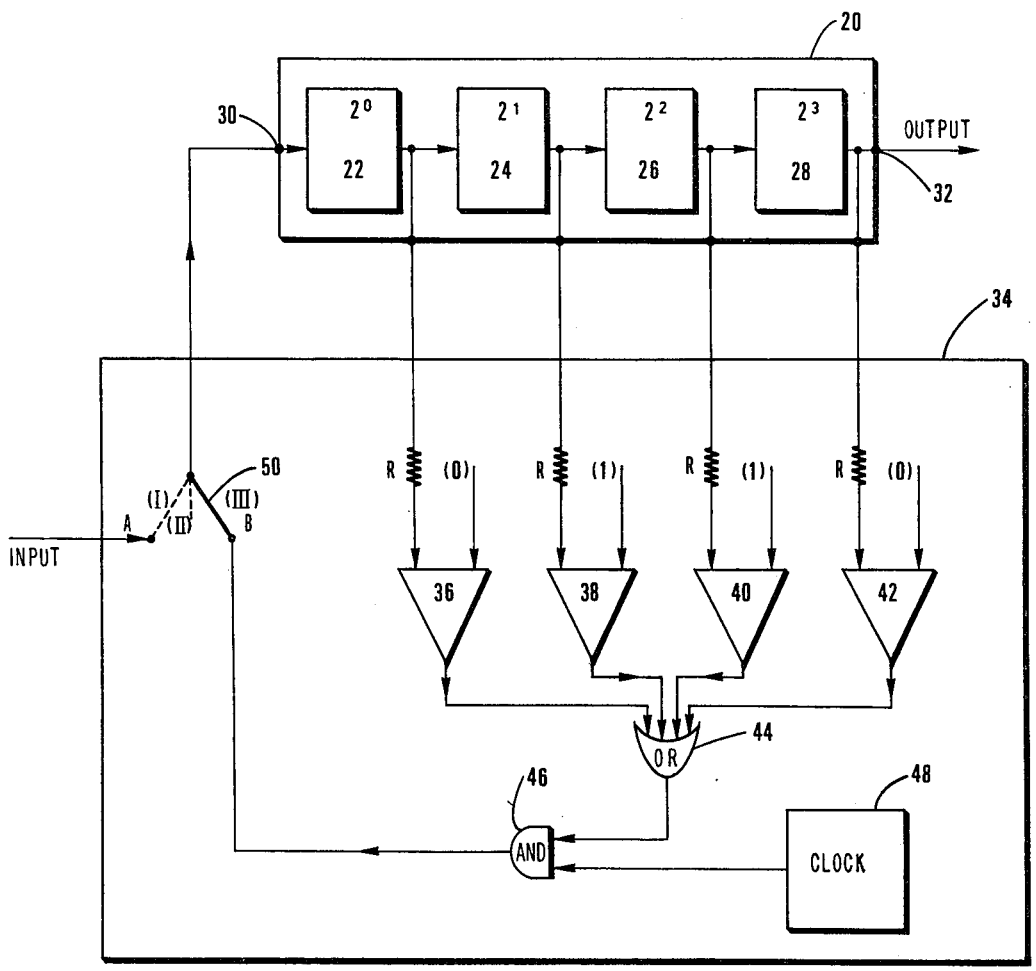
FIGS. 2 and 3 are schematic diagrams of two embodiments, made in accordance with the present invention, which enable the presetting of a counter to a predetermined initial count.

FIG. 2 illustrates at 20 a 4-digit counter comprised of, in a conventional manner, of four flip-flops 22, 24, 26 and 28, connected in series between a count input terminal 30 and an output terminal 32, with the respective weights of $2^0$, $2^1$, $2^2$, and $2^3$.

The first type of apparatus in accordance with the invention is generally referenced as 34. This device 34 has four voltage comparators 36, 38, 40 and 42 each connected to one output of flip-flops 22, 24, 26 and 28 respectively, via a resistor R of high resistance and of very low stray capacitance. The respective reference voltage levels of these comparators are the opposite logic levels of those which are present on the outputs of the flip-flops to which they are connected when the counter is in the desired initial count. Thus, for example, if the counter is to be preset to the count 9, defined by the logic levels 1 0 0 1 on the respective outputs of its four flip-flops, the reference levels of the comparators 36, 38, 40 and 42 will be the logic levels 0 1 1 0 respectively.

The reference levels of the comparators are obtained by switches, not shown on FIG. 2, whose positions define the initial count to which the counter is to be preset.

The outputs of the four comparators are connected to the respective inputs of a four-input OR gate 44. The output of the OR gate 44 is connected to an input of a two-input AND gate 46 whose second input is connected to the output of a low-frequency clock pulse generator 48. The output of the AND gate 46 is connected to a terminal B. The pulses to be counted are applied to a terminal A and a switch 50 connects the count input 30 to either the terminal A (position I) or the terminal B (position III).

The operation of the above-described apparatus is as follows. During the count phase, the switch 50 is placed in position I and the pulses applied to the input terminal A are applied to the counter 20. When this phase is completed, the switch 50 is placed in an intermediate position II for the time necessary to read the recorded count. After this reading, the switch 50 is placed in the position III, represented by the plain line so as to set the counter 20 to the desired initial count prior to a new count phase. If, at the time of switching, the counter is already at the desired initial count, none of the four comparators 36, 38, 40 and 42 will receive, from the associated flip-flop, the logic level necessary for activating its output, so that the output of the OR gate 44 remains at the level 0, thereby preventing the AND gate 46 from passing pulses from the clock 48 to the count input 30. Thus the counter 20 stays at the same count. If, on the other hand, when the switch 50 is placed in the position III, the counter displays a count different from the desired initial count, at least one of its flip-flops applies to the associated comparator the logic level causing its activitation. The output of the OR gate 44 is activated and causes the AND gate 46 to pass the pulses from the clock 48 to the count input 30. The counter counts up at the rate of the clock pulses as long as the output of the OR gate 44 remains activated, i.e. as long as at least one of the four comparators is activated. When the counter 20 is in the desired initial count, none of the four flip-flops activates its associated comparator, the output of the OR gate 44 is deactivated and closes the AND gate 46. The counter 20 is thus kept in the desired initial count and a new count phase can begin.

The above-explained mode of operation is illustrated by the following table showing the successive states of the flip-flops, comparators and OR gate during a presetting phase when it is desired to preset the counter to 9 starting from count 5.

| State of flip-flops $2^0\ 2^1\ 2^2\ 2^3$ | Output of comparators $2^0\ 2^1\ 2^2\ 2^3$ | Output of OR gate | Clock pulses applied to counter |
|---|---|---|---|
| (5) 1 0 1 0 | 0 0 1 1 | 1 | 1 |
| (6) 0 1 1 0 | 1 1 1 1 | 1 | 1 |
| (7) 1 1 1 0 | 0 1 1 1 | 1 | 1 |
| (8) 0 0 0 1 | 1 0 0 0 | 1 | 1 |
| (9) 1 0 0 1 | 0 0 0 0 | 0 | 0 |

It can be seen that the OR gate 44 causes the application to the input 30 of the counter, via the AND gate 46, of four pulses from the clock 48, said pulses causing the counter to count up from 5 to 9. At count 9, the four comparators are simultaneously at zero and the output of OR gate 44 is therefore zero which disables the AND gate 46; the counter 20 is then no longer fed with pulses.

Of course, this technique is also applicable when the counter is comprised of a single flip-flop (scale-of-two counter). In this case, the OR gate 44 is of course no longer necessary and the output of the comparator associated with the flip-flop is applied directly to the AND gate 46.

Figure 3:
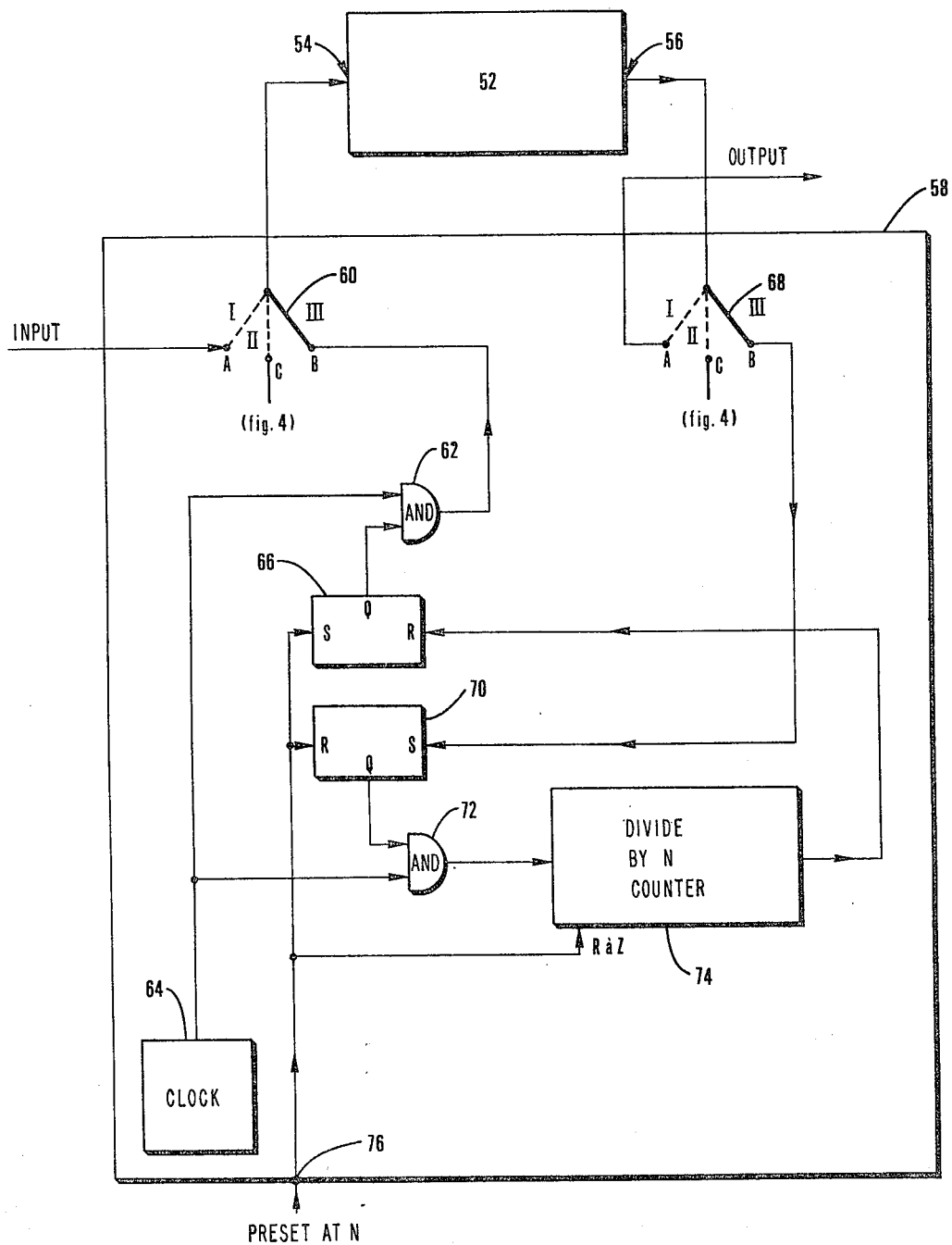

In FIG. 3, a blind counter, which has only one input 54 and one output 56, is shown as a general reference 52. The second type of apparatus made in accordance with the present invention which presets the counter 52 to a given initial count is designated by the general reference 58. The apparatus 58 comprises a first switch 60 for connecting the input 54 of the counter either to a terminal A to which are applied the pulses to be counted (position I), or to a terminal B connected to the output of a two-input AND gate 62 (position III). A first input of the AND gate 62 is connected to the output of a low-frequency clock pulse generator 64 and the second input is connected to the output Q of a flip-flop 66. A second switch 68 connects the output 56 of the counter 52 either to a terminal A (position I)

which constitutes the external output of the counter 52, or to a terminal B (position III) which is connected to the S input of a flip-flop 70. The two switches 60 and 68 are actuated by a single control, not shown, which enables both of them to be placed simultaneously in the position I (terminals A), in the position III (terminals B) or in an intermediate position II (terminals C). The output Q of the flip-flop 70 is connected to one input of a two-input AND gate 72 the other input of which is connected to the output of the clock pulse generator 64. The output of the AND gate 72 is connected to the input of a counter 74 whose output is connected to the R input of the flip-flop 66. The counter 74 is a conventional programmable counter constituting a divider by N, N being the initial count to which the counter 52 is to be preset. At last, a terminal 76, on which is applied the preset control signal, is connected to the S input of the flip-flop 66, to the R input of the flip-flop 70 and to the reset input of the divider 74.

The mode of operation of the circuit of FIG. 3 is as follows. During the count phase, the switches 60 and 68 are both in the position I. The pulses applied to the terminal A of the switch 60 are thus also applied to the counter 52 and the terminal A of the switch 68 delivers an output pulse when the counter overflows or resets. At the end of the count phase, the two switches are simultaneously placed in the intermediate position II for the time necessary for displaying the recorded count, which can be achieved by means of an apparatus which will be described hereinafter with reference to FIG. 4. Then the two switches are placed in the position III which corresponds to a presetting of the counter 52 to the desired initial count N which is determined by the divider 74. The preset control signal is applied to the terminal 76 so as to reset the divider 74 and the flip-flop 70 as well as to set the flip-flop 66. The output Q of the flip-flops 66 and 70 are thus respectively at 1 and 0 levels so that the AND gate 72 is disabled while the AND gate 62 is enabled and causes the pulses from the clock 64 to be applied to the input 54 of the counter 52. The counter 52 counts up to its maximum count, then resets and delivers on its output 56 an overflow pulse which sets the flip-flop 70. The outputs Q of the flip-flop 70 is at the level 1 and causes the AND gate 72 to pass the pulses from the generator 64 to the divider 74. Both counters 52 and 74 thus start simultaneously from zero and when they reach the count N, the counter 74 delivers a pulse which resets the flip-flop 66. The output Q of the flip-flop 66 is at the level 0 wich disables the AND gate 62. The counter 52 is thus kept in the desired initial count N and a new count phase can begin.

The above-described apparatus can be simplified when it is intended to be used only for resetting a counter. The flip-flop 70, the AND gate 72 and the divider 74 can be eliminated and the terminal B of the switch 68 is connected to the R input of the flip-flop 66. In this particular configuration, the preset control signal sets the flip-flop 66 so that it enables the AND gate 62. When the counter 52 resets, the overflow pulse disables the AND gate 62 and the counter 52 is thus kept at zero.

Figure 4:
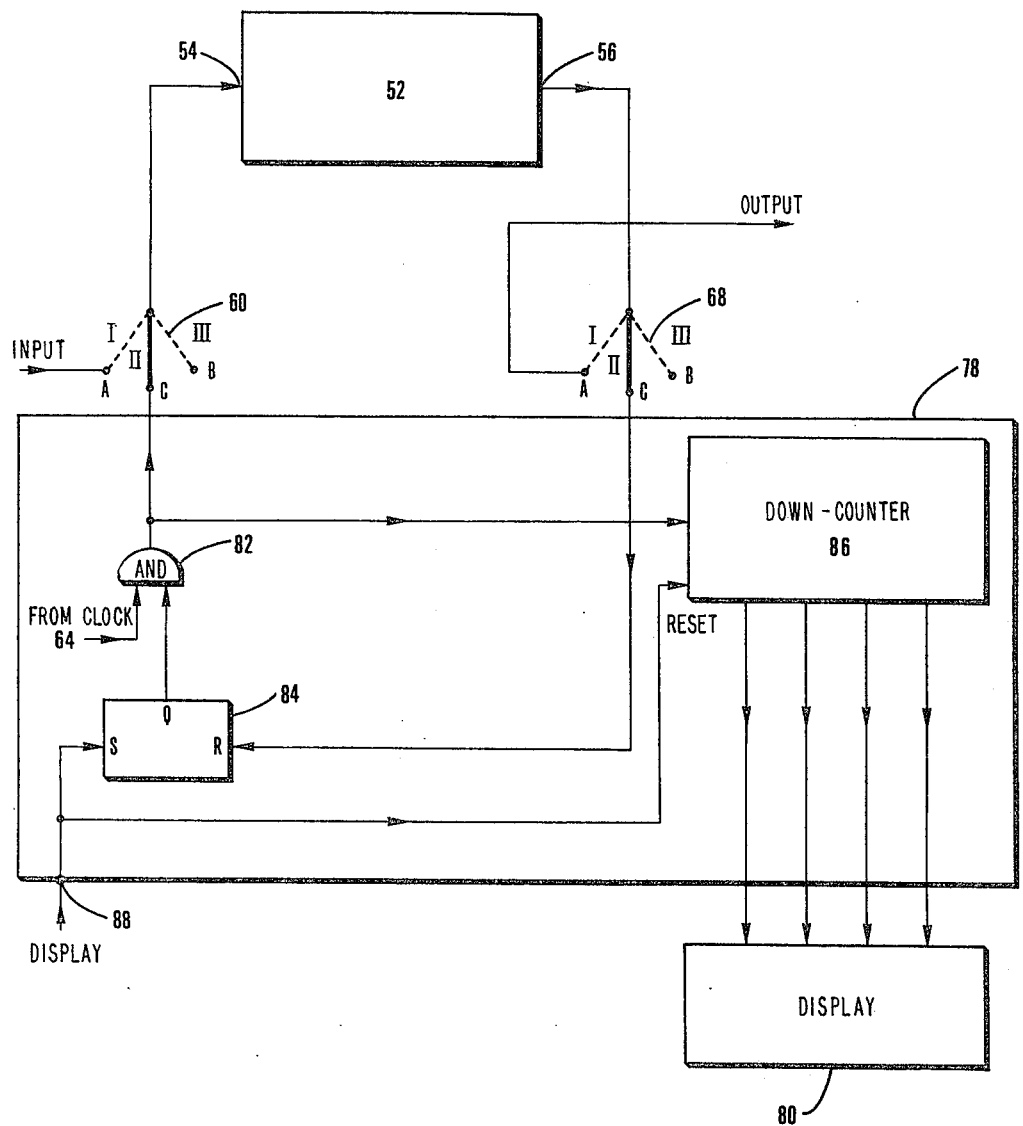
FIG. 4 is a schematic diagram of an embodiment made in accordance with the present invention for displaying the state of a blind counter.

FIG. 4 is a schematic diagram of a display apparatus 78 made in accordance with the present invention. The display apparatus 78 is connected to the terminals C of the switches 60 and 68 of the device 58 of FIG. 3 so as to display, on a unit 80, the state of the blind counter 52. The display apparatus 78 comprises a two-input AND gate 82 whose output is connected to the terminal C of the switch 60 and to a count input of a down-counter 86. The inputs of the AND gate 82 are connected to the output of the clock pulse generator 64 and to the output Q of a flip-flop 84 respectively. The R input of the flip-flop 84 is connected to the terminal C of the switch 68. The down-counter 86 having the same capacity as the counter 52, has its parallel outputs connected to the display unit 80. Lastly, a terminal 88, on which is applied a display signal (level 1), is connected, on the one hand, to the reset input of the counter 86 and, on the other hand, to the S input of the flip-flop 84.

The circuit described in relation with FIG. 4 operates as follows. Assuming that the switches 60 and 68 are both in the intermediate position II, the display signal is applied to the terminal 88 to reset the counter 86 and to set the flip-flop 84. The flip-flop 84 enables the AND gate 82 and, as a result, the pulses from the generator 64 are applied to the counter 52 which counts up from an unknown initial count L to be displayed to zero. The counter 52, with a capacity of K, will thus receive K-L pulses before resetting and delivering on its output 56 an overflow pulse which resets flip-flop 84 and thus disables the AND gate 82. As these K-L pulses have also been applied to the down-counter 86, initially at 0, at the end of the K-L pulses the down-counter will then be in the count L which appears on the display unit 80.

It should be noted that the display apparatus of FIG. 4 performs the resetting of the counter 52 and the display of its count. This display apparatus moreover offers the significant advantage of being able to code or to decode. In fact, if the blind counter 52 is designed, for example, according to the code 1-2-2-4 and if the down-counter 86 is designed according to the code 1-2-4-8, a binary-coded decimal code is obtained at the output. The down-counter 86 can also have a Johnson cycle, so that decimal data from 0 to 9 can be obtained. It should finally be noted that the display apparatus stores the state of the counter during the following count phase.

What is claimed is:

1. Apparatus for automatically presetting an electric pulse counter to a given initial count, comprising first means, triggered by a preset signal, for applying pulses to the input of the counter, and second means, triggered by the overflow pulse appearing at the output of the counter when it resets to cause the application to its input of a number of pulses equal to said initial count.

2. Apparatus according to claim 1 wherein said first means comprise a pulse generator, a flip-flop whose set input receives the preset signal, an AND gate with two inputs respectively connected to the outputs of said generator and said flip-flop, and a switch for connecting during the preset operation the output of said AND gate to the input of the counter.

3. Apparatus according to claim 2 wherein the second means comprises a flip-flop whose set input is connected to the output of the counter and whose reset input receives the preset signal, an AND gate with two inputs respectively connected to the outputs of said pulse generator and of said flip-flop of said first means, and a counter-divider, dividing by a number equal to the desired initial count, whose input and output are connected to the output of said AND gate of said second means and to the reset input of said flip-flop of said first means, respectively, and whose reset input receives the preset signal.

4. Apparatus for automatically resetting an electric pulse counter adapted to provide on is output an overflow pulse when it resets, comprising a pulse generator, a flip-flop whose set input receives a reset signal and whose reset input is connected to the output of the counter, an AND gate with two inputs respectively connected to the outputs of said generator and of said flip-flop, and a switch for connecting during the reset operation, the output of said AND gate to the input of the counter.

5. Apparatus for the display of the count of a counter adapted to provide on its output an overflow signal when it resets comprising a pulse generator, a flip-flop whose set input receives a display signal and whose reset input is connected to the output of the counter, an AND gate with two inputs respectively connected to the outputs of said pulse generator and of said flip-flop, a switch for connecting, during the display operation, the output of said AND gate to the input of the counter, and a down-counter, reset by said display signal, which also receives the pulses applied to the counter, whereby the count in said down-counter when said counter produces an overflow signal is the count to be displayed.

6. Apparatus for displaying a count stored in a counter without interrogating the status of the individual stages of the counter, comprising:
 a down-counter having a capacity which corresponds to the capacity of the counter;
 first means for applying pulses to said counter and said down-counter; and
 second means, coupled to the output of said counter, for disabling said first means in response to an output of said counter;
 whereby the final count in said down-counter is the count to be displayed.

7. Apparatus as defined by claim 6 further comprising means for resetting said down-counter prior to the application of said pulses by said first means.

8. Apparatus for presetting a counter to a predetermined count in response to a preset command signal and for subsequently displaying a final count stored in the counter in response to a display command signal, both operations being effected without the need for coupling to individual stages of the counter, comprising:
 a counter-divider adapted to divide by a number equal to the predetermined count;
 a down-counter having a capacity which corresponds to the capacity of the counter;
 first means responsive to said preset command signal for resetting said counter and for simultaneously applying pulses to said counter and said counter-divider;
 second means, coupled to the output of said counter-divider for disabling said first means in response to an output of said counter-divider;
 third means responsive to said display command signal for resetting said down-counter and for simultaneously applying pulses to said counter and said down-counter; and
 fourth means responsive to the output of said counter, for disabling said third means in response to the output of said counter;
 whereby the final count in said down-counter is the final count to be displayed.

* * * * *